United States Patent
Kitagawa et al.

Patent Number: 5,938,841
Date of Patent: Aug. 17, 1999

[54] DEVICE FOR PRODUCING A SINGLE CRYSTAL

[75] Inventors: Kouji Kitagawa; Kouji Mizuishi, both of Annaka; Masahiko Urano, Takasaki; Kenji Araki; Eiichi Iino, both of Annaka; Izumi Fusegawa, Nishishirakawa, all of Japan

[73] Assignee: Shin-Etsu Handotai Co., Ltd., Tokyo, Japan

[21] Appl. No.: 08/754,784

[22] Filed: Nov. 21, 1996

[30] Foreign Application Priority Data

Dec. 6, 1995 [JP] Japan .................................. 7-344375

[51] Int. Cl.⁶ .................................................. C30B 35/00
[52] U.S. Cl. ............................... 117/208; 117/30; 117/32; 117/917
[58] Field of Search ................................. 117/14, 15, 30, 117/32, 208, 917

[56] References Cited

U.S. PATENT DOCUMENTS

| | | | |
|---|---|---|---|
| 4,436,577 | 3/1984 | Frederick et al. | 117/20 |
| 5,178,720 | 1/1993 | Frederick | 117/14 |
| 5,306,387 | 4/1994 | Fusegawa et al. | 117/14 |
| 5,359,954 | 11/1994 | Fusegawa et al. | 117/13 |
| 5,359,959 | 11/1994 | Fusegawa et al. | 117/13 |

FOREIGN PATENT DOCUMENTS

| | | |
|---|---|---|
| 0429847 | 6/1991 | European Pat. Off. . |
| 2024649 | 1/1980 | United Kingdom . |

OTHER PUBLICATIONS

V. R. Genrikhson et al., "Crucible Rotator With Acceleration", *Instruments and Experimental Techniques*, vol. 29, No. 2, Apr., 1986, pp. 507–508.

*Primary Examiner*—Felisa Hiteshew
*Attorney, Agent, or Firm*—Oliff & Berridge, PLC

[57] ABSTRACT

A novel device for producing a single crystal by the CZ or MCZ method is provided, which comprising a crucible for containing silicon melt therein, a wire reel and a wire for pulling a single crystal, a motor and a rotation shaft for rotating the crucible, a speed change device being inserted between the motor and the rotation shaft, and, if necessary, a magnetic field generator, by which the magnetic field is applied to the melt. According to the device for producing a single crystal, the rotation accuracy of a crucible can be improved, so that the concentrations of impurities in the pulled single crystal can be highly precisely controlled.

22 Claims, 4 Drawing Sheets

DEVICE FOR PRODUCING A SINGLE CRYSTAL

TECHNICAL FIELD

The present invention relates to a device and method for producing various crystal materials of semiconductors, dielectrics, magnets, etc., by the Czochralski method.

BACKGROUND OF THE INVENTION

The crystal materials of semiconductors, dielectrics, magnets, etc., for example, silicon semiconductors, compound semiconductors, or oxide single crystals such as lithium niobate, are developed and used as highly functional materials in the field of electronics or optoelectronics, so that they are becoming increasingly important.

These crystal materials are in general produced by the Czochralski method (hereinafter, referred to as the CZ method) as a single crystal in a form of a rod the single crystal being from a crucible in which raw materials for growing a single crystal are filled and melted.

It is generally known that constitute components (for example, oxygen) of a crucible, for example, a quartz crucible, as well as some impurities included in the raw materials, are incorporated into the pulled single crystal in the case where crystal growing is carried out by the CZ method.

The concentrations of the impurities incorporated into the pulled single crystal are dependent on the speed of crystal rotation, the speed of crucible rotation, the distribution of the temperature of the melt, etc., because the speed of crystal rotation has an influence on the melt convection flow, the speed of crucible rotation has an effect on the melt convection flow and the oxygen concentration in the melt itself, and the distribution of the temperature of the melt has an influence on the melt convection flow. Therefore, it is possible to control the concentrations of the impurities to some extent by controlling these factors.

It is, however, difficult to control the melt convection flow, so that the melt convection flow can not be sufficiently controlled only by the above factors.

Then, a method where a single crystal is pulled by the CZ method, with applying a magnetic field to the melt, the method being called the magnetic-field-applied Czochralski method (hereinafter, referred to as the MCZ method) was developed.

In a single crystal produced by the MCZ method, the concentrations of the impurities in the crystal, for example, the oxygen concentration can be more extensively and more precisely controlled than that in a single crystal produced by the CZ method, and swirl defects and striations, etc. are also decreased, when the melt has electric conductivity as silicon melt. This is due to the suppression of the thermal convection in the melt by increasing the effective viscosity of the melt by applying a magnetic field.

On the other hand, single crystal materials must meet more and more requirements due to high-precision and high-integration, etc. of devices such as semiconductors. Regarding the concentrations of impurities in a single crystal, it is known, for example, that the oxygen concentration and distribution in a semiconductor silicon single crystal have great influences on the characteristics of the semiconductor devices from the silicon single crystal. That is, if the oxygen concentration is too high, crystal defects or oxide precipitates generate and have various harmful effects on the characteristics of the semiconductor devices.

However, if such crystal defects or oxide precipitates generate in the region except for the active region of the semiconductor devices, those behave as gettering sites of heavy metal impurities, so that the characteristics of the semiconductor devices can be improved ("intrinsic gettering"). Therefore, if the oxygen concentration is too low, the characteristics of the device can not be improved.

Accordingly, the crystal materials are required to contain the sorts and concentrations of impurities to be desired depending on the type of a device to be produced, and the allowable ranges of the concentrations thereof is becoming remarkably limited. At present, it is impossible to highly control the concentrations of the impurities in a single crystal and to meet such strict requirements by simply using the MCZ method.

The present invention was made in view of the foregoing, and therefore an object of the present invention is to highly precisely control the concentrations of the impurities in a single crystal to be grown.

SUMMARY OF THE INVENTION

The present invention is based upon the discovery that the above object can be solved by a device capable of pulling a crystal with highly precisely controlling the speed of rotation of a crucible containing silicon melt therein and if necessary, simultaneously with controlling the melt convection flow by applying a magnetic field.

According to the present invention, it is provided a device for producing a single crystal by a Czochralski method, comprising
  a crucible for containing silicon melt therein,
  means for pulling a single crystal from the crucible, and
  means for rotating the crucible,
  the means for rotating the crucible being equipped with speed change means.

Furthermore, the present invention also provides a device for producing a single crystal by a magnetic-field-applied Czochralski method, comprising
  a crucible for containing silicon melt therein,
  means for pulling a single crystal from the crucible,
  means for rotating the crucible,
  the means for rotating the crucible being equipped with speed change means, and
  means for generating a magnetic field, by which the magnetic field is applied to the melt Moreover, the present invention provides a method for controlling rotation accuracy of a crucible, which comprising
  using the device described above, and
  controlling a speed of crucible rotation, whereby the rotation accuracy of the crucible is controlled to less than ±0.02 rpm; and
  a process for producing a single crystal, which comprising
  using the device described above, and
  pulling a single crystal with changing a speed of crucible rotation, whereby rotation accuracy of the crucible is controlled to less than ±0.02 rpm.

According to the present invention, in the device for producing a single crystal by the CZ or MCZ method, the speed of crucible rotation can highly precisely controlled. Therefore, when a single crystal is produced by using the device, the change or variation of the concentrations of impurities which are derived from the crucible can be restrained, so that a single crystal containing the impurities to be desired in the required concentrations can be obtained, which leads to the improvement of the characteristics of various devises produced by the single crystal.

BRIEF DESCRIPTION OF THE DRAWINGS

For a better understanding of the present invention as well as other objects and features thereof, reference is made to the following detailed description to be read in conjunction with the accompanying drawings, wherein.

DETAILED DESCRIPTION OF THE INVENTION

The present invention will be described in further detail by way of example in the case of producing a semiconductor silicon single crystal from silicon melt by the MCZ method, if necessary, with reference to the accompanying drawings, and is not limited to the description.

When a silicon single crystal is produced by the CZ method or the MCZ method, a quarts crucible is in general used as a crucible which is filled with raw materials. Accordingly, oxygen which is one of the constitute components of quarts is incorporated into a single crystal to be pulled so that it is necessary to highly precisely control the oxygen concentration.

The present inventors have found that the oxygen concentrations in crystals pulled by the MCZ method have remarkable variation between the pulled crystals or between the devices used for pulling the crystals although the melt convection flow is suppressed in the MCZ method. The results shown in FIG. 3 were obtained when a test of pulling crystals was carried out under the condition that the applied magnetic field, the crystal rotation and the other factors which affect the distribution of the temperature in the melt were constant and only the speed of crucible rotation was varied.

Figure 3:
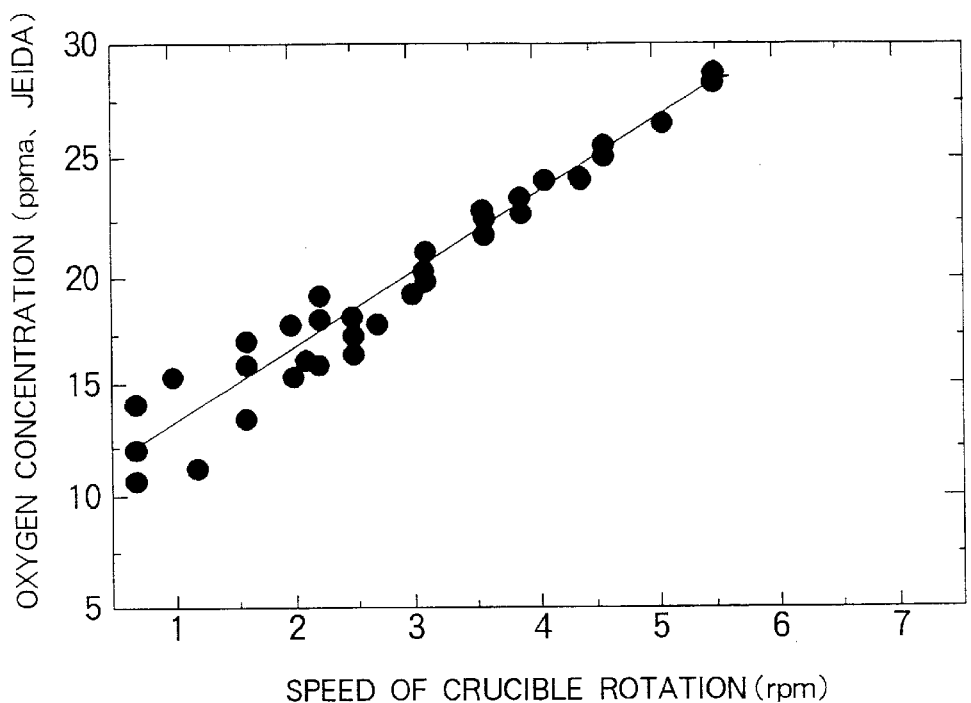
FIG. 3 is a graph showing the relationship between the speed of crucible rotation and the oxygen concentration in the crystal when the crystal was pulled by a conventional device.

FIG. 3 shows the relationship between the speed of crucible rotation and the oxygen concentration in the pulled crystal. From FIG. 3, it can be seen that they have a correlative relationship on the whole but in detail involve remarkable variation. This great variation is remarkable in particular in a low-speed range of crucible rotation.

From the above-noted results, the present inventors have presumed the followings:

i) In the MCZ method where the melt convection flow is suppressed, a primary factor of variation of the oxygen concentration in a single crystal to be pulled is the speed of crucible rotation, and therefore, slight variation or error of the speed of crucible rotation greatly affects the oxygen concentration;

ii) In view of the fact that the variation of the oxygen concentration is remarkably great in a low-speed range of crucible rotation, the rotation accuracy of a motor which rotates crucible is not sufficient.

That is, since the melt convection flow is suppressed in the MCZ method where a horizontal magnetic field is applied to the melt, the oxygen concentration in a silicon single crystal to be produced is greatly influenced by the speed of crucible rotation. As a result, the slight variation or error of the speed of crucible rotation greatly affects the oxygen concentration. Therefore, it is necessary to highly precisely control, particularly the rotation of a crucible in the MCZ method.

The present inventors have found that the accuracy of the rotation mechanism of a crucible in the conventional device is not sufficient for the CZ, in particular, MCZ method from now on, and aimed at the improvement of the accuracy and accomplished the present invention.

In the mechanism of rotating a crucible, which is used in the conventional device for producing a single crystal by the CZ or MCZ method, a speed change device is not used and the speed of crucible rotation is controlled based on the set maximum speed of crucible rotation in the whole range of the speed of crucible rotation by one servomotor. In the conventional device for producing a single crystal by the CZ or MCZ method, the maximum speed of crucible rotation is generally 20 to 50 rpm, so that the speed of crucible rotation can be sufficiently controlled by the above mechanism.

In general, however, the rotation accuracy of a motor is corresponding to the accuracy for the maximum speed of motor rotation, and higher speed of motor rotation leads to higher rotation accuracy of the motor and lower speed of motor rotation leads to lower rotation accuracy of a motor. That is, in general, the rotation accuracy of a motor is represented by a rotation error (± %) for the maximum speed of motor rotation, and the rotation variation (± rpm) of the motor, which is calculated from the rotation error, is present in the whole range of the speed of motor rotation. Therefore, the following relationship:

Rotation Accuracy of Crucible≈Rotation Variation×Reduction Ratio, wherein Reduction Ratio is a ratio of the speed of rotation of a motor shaft to the speed of rotation of a crucible shaft, can be assumed, this relationship representing that the rotation accuracy of a crucible is not sufficient in a low-speed range of crucible rotation.

Therefore, in order to improve the rotation accuracy of a crucible in the whole required range of the speed of crucible rotation, it is effective that the reduction ratio is changed by a speed change device and the whole range of the speed of crucible rotation is divided into some ranges to control the speed of crucible rotation.

The term "speed change device" used herein is intended to refer to a device capable of suitably changing engagement of gears or the like between the primary shaft (in this context, corresponding to the motor shaft) having a constant speed of rotation and the secondary shaft (in this context, corresponding to the crucible shaft) and changing the speed of rotation of the secondary shaft; Using the speed change device, a variety of the speed of rotation of the secondary shaft are obtained. In the present invention, the speed change device and the servomotor are combined to highly precisely control the speed of crucible rotation in the whole range to be required. That is, it is necessary to increase the reduction ratio of the speed of rotation of the motor shaft to the speed of rotation of the crucible shaft in order to improve the accuracy of the speed of crucible rotation. In accordance with the present invention, the reduction ratio is increased by dividing the whole range of the speed of crucible rotation into some ranges and decreasing the maximum speed of crucible rotation in each range. The speed change device is provided with a clutch, a slide gear, etc., by which the reduction ratio can be changed to control all divided ranges of the speed of crucible rotation.

The embodiment of the present invention will be explained in reference to the accompanying drawings.

Figure 1:
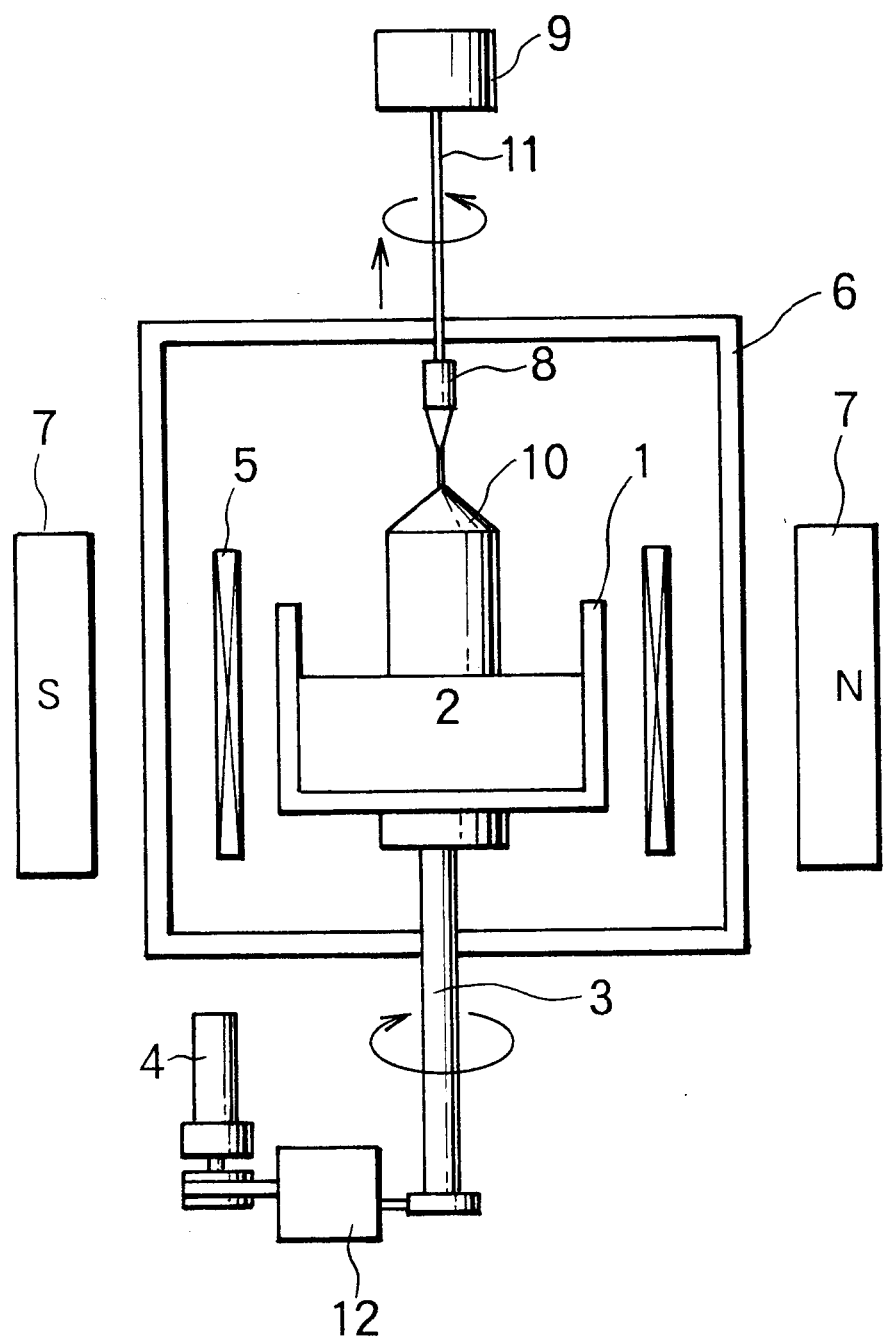
FIG. 1 is a schematic illustration of an embodiment of the device of the present invention.

FIG. 1 shows a schematic illustration of the device for producing a single crystal by the MCZ method according to the present invention. In FIG. 1, the numeral 1 indicates a quartz crucible, which is filled with silicon melt 2 and is rotated by a rotation shaft 3. The rotation shaft 3 is driven by a servomotor 4, by which the speed of crucible rotation is controlled. The crucible 1 is surrounded by a cylindrical heater 5 made of graphite for example. The heater 5 is, if necessary, surrounded by a cylindrical heat insulating material (not shown in FIG. 1). The crucible 1 is located in a chamber 6. Outside of the chamber 6, a magnetic filed generator 7 such as a permanent magnet or an electromagnet is arranged. A static magnetic field in a defined direction, for example, a horizontal magnetic field, is applied to the silicon melt 2 by the magnetic field generator 7. The numeral 8 indicates a single crystal silicon seed, which is dipped into the melt and pulled with rotation along the central axis by a wire reel 9 and a pulling wire 11. In such a manner, a silicon single crystal 10 is produced by the MCZ method.

In such production of a single crystal by the MCZ method, it is important to highly precisely control, particularly the speed of crucible rotation. For the reason, in the present invention, as shown in FIG. 1, the device for rotating the crucible comprising the servomotor 4 and the rotation shaft 3 is equipped with a speed change device 12, that is, the speed change device 12 is inserted between the servomotor 4 and the rotation shaft 3.

Figure 2:
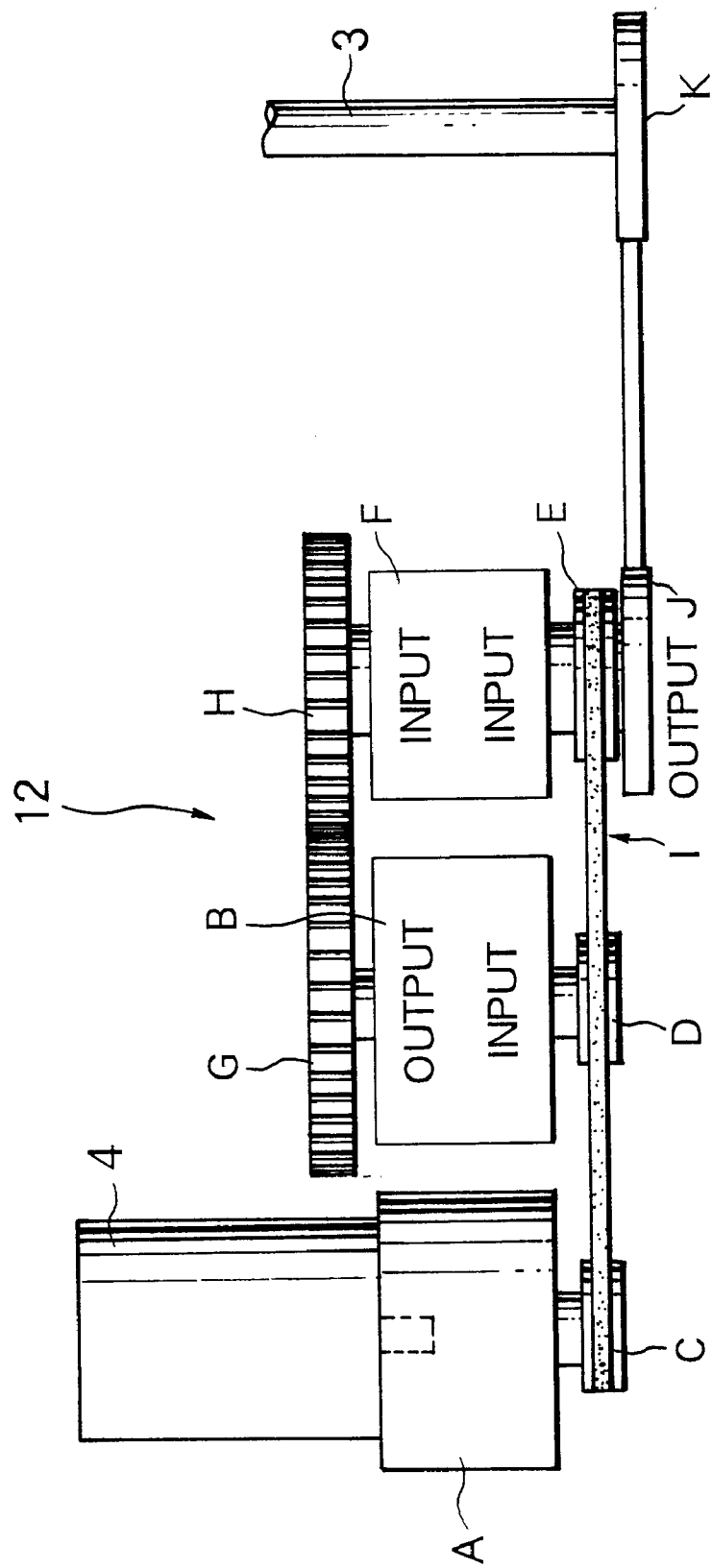
FIG. 2 is a partial enlarged detail of the embodiment shown in FIG. 1.

FIG. 2 shows the speed change device 12 shown in FIG. 1 in detail. As shown in FIG. 2, the servomotor 4 is engaged with a reduction gear A, and the reduction gear A, the input side of a reduction gear B and a double clutch F are connected to a timing belt I by timing gears C, D, E. The output side of the reduction gear B is engaged with the double clutch F via gears G, H. The double clutch F comprises two clutch mechanisms in one unit. One clutch mechanism is used for connecting the gear H to a pulley J, and the other clutch mechanism is used for connecting the timing gear E and the pulley J. It is possible to select a clutch mechanism to be operated by switching the clutch F. Furthermore, the pulley J is connected to a pulley K, so that the speed of crucible rotation can be controlled to two ranges.

For example, when the maximum speed of rotation of the servomotor 4 is 3000 rpm, and, the reduction ratio of the reduction gear A is 1/75 and that of the reduction gear B is 1/10, the timing gear E has the maximum speed of rotation of 40 rpm and the gear H has the maximum speed of rotation of 4 rpm. When either of the gear H and the timing gear E is connected to the pulley J by the double clutch F, the pulley J can have the maximum speed of rotation of 4 rpm or 40 rpm.

Therefore, the crucible rotation can be more precisely controlled in both of the high-speed range and the low-speed range of crucible rotation, by combining the pulley J with the gear H if the crystal is pulled in the low-speed range of crucible rotation, and, by combining the pulley J with the timing gear E if the crystal is pulled in the high-speed range of crucible rotation, respectively.

The examples of the present invention are shown as follows:

EXAMPLE 1

The device for producing a single crystal by the CZ method according to the present invention which is provided with a device for rotating the crucible equipped with a speed change device as shown in FIG. 2 (WORKING EXAMPLE) and the conventional device for producing a single crystal by the CZ method which is provided with a device for rotating the crucible without a speed change device (COMPARISON) were used, both of which comprises a quarts crucible of 18 inches in diameter capable of filling 60 kg of polycrystalline silicon to produce a silicon single crystals of 6 inches in diameter, and the crucible rotation accuracy was measured in the low-speed range of crucible rotation which generally leads to large errors. The results are shown in FIG. 4.

Figure 4:
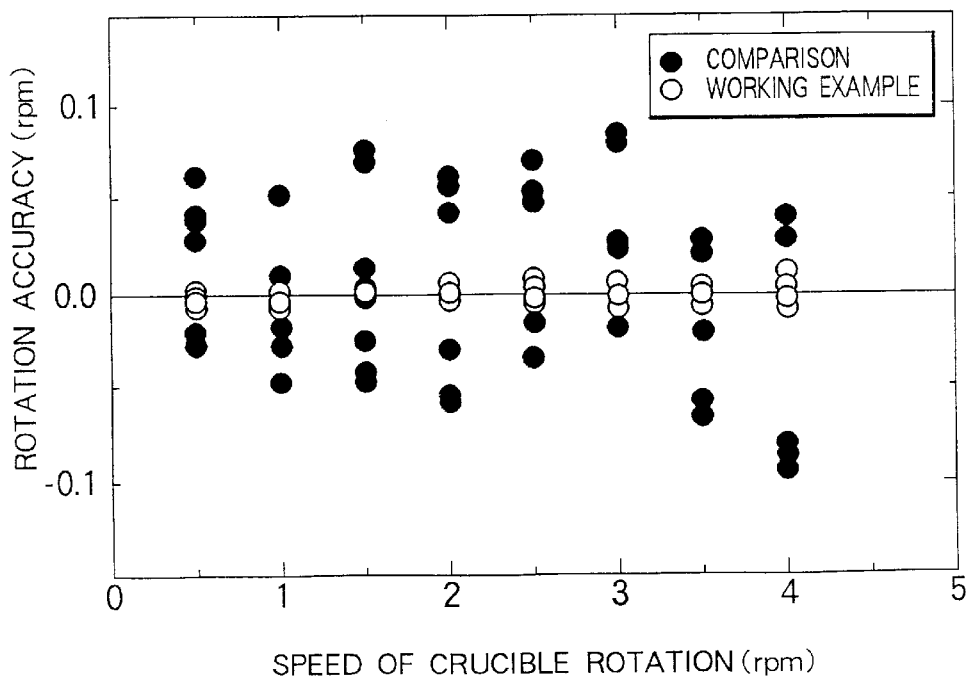
FIG. 4 is a graph showing the results of the measured rotation accuracy of the crucibles in a device of the present invention and a conventional device.

As seen from FIG. 4, in the device according to the present invention, the crucible rotation accuracy was remarkably improved, the accuracy being controlled to less than ±0.02 rpm in the low-speed range of crucible rotation. On the other hand, in the conventional device, the accuracy was not sufficient, the accuracy being controlled to less than ±0.1 rpm.

EXAMPLE 2

The device, as shown in FIG. 1, for producing a single crystal by the MCZ method according to the present invention which is provided with the device for rotating the crucible equipped with the speed change device was used and the quarts crucible of 18 inches in diameter was filled with 60 kg of polycrystalline silicon and, from the crucible, silicon single crystals of 6 inches in diameter were produced with applying the magnetic field of 2500 gausses, and the relationship between the speed of crucible rotation and the oxygen concentration in the crystals was inquired. The results are shown in FIG. 5.

Figure 5:
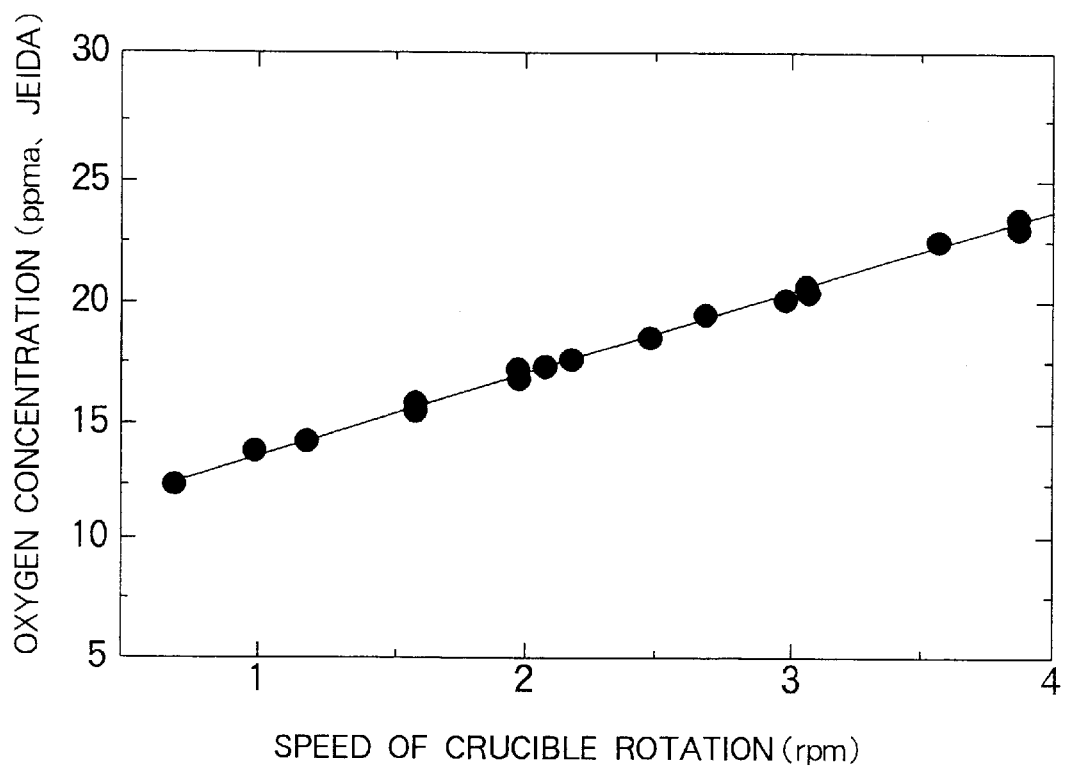
FIG. 5 is a graph showing the relationship between the speed of crucible rotation and the oxygen concentration in the crystal when the crystal was pulled according to the present invention.

From seen from FIG. 5, the oxygen concentration in the crystal can be highly precisely controlled in the low-speed range of crucible rotation if the device according to the present invention is used.

The present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

For example, in the above embodiment, the whole range of the speed of crucible rotation is divided into two ranges to control the speed of crucible rotation, but it is also advisable to divide the whole range of the speed of crucible rotation into three or four, or more ranges to more minutely control the crucible rotation. In order to change gears, a slide gear, a back gear, a swing link gear, etc. can be used other than the clutch.

Furthermore, it is not limited to use only one motor, and it is also possible to combine a plural number of motors with the speed change device.

Moreover, the present invention can apply to the production of a single crystal by the CZ method as well as that by the MCZ method, and can also apply to the pulling of any semiconductors other than silicon semiconductors, any compound semiconductors or any oxide single crystals.

What is claimed is:

1. A device for producing a single crystal by a Czochralski method, comprising:

a crucible for containing silicon melt therein;

means for pulling a single crystal from the crucible; and means for rotating the crucible, said means for rotating the crucible including speed change means for controlling a rotation speed of said crucible so that the rotation speed is maintainable substantially at a given rotation speed.

2. The device of claim 1, wherein said means for rotating the crucible including said speed change means controls the rotation speed of said crucible within a rotation accuracy to less than ±0.02 rpm at the given rotation speed.

3. A process for producing a single crystal by the Czochralski method using the device of claim 1, comprising:

providing a silicon melt within said crucible;

rotating said crucible at the rotation speed;

controlling the rotation speed of said crucible so that the rotation speed is maintained substantially at a given rotation speed; and pulling a crystal from said crucible.

4. The process of claim 3, wherein said rotation speed is controlled such that a rotation accuracy of the crucible is controlled to less than ±0.02 rpm at the given rotation speed.

5. The process of claim 3, wherein the given rotation speed is less than about 2 rpm.

6. The device of claim 1, wherein the given rotation speed is less than about 2 rpm.

7. A device for producing a single crystal by a magnetic-field-applied Czochralski method, comprising:

a crucible for containing silicon melt therein;

means for pulling a single crystal from the crucible;

means for rotating the crucible, said means for rotating the crucible including speed change means for controlling a rotation speed of said crucible so that the rotation speed is maintainable substantially at a given rotation speed; and means for generating a magnetic field which is applied to the silicon melt.

8. The device of claim 7, wherein said means for rotating the crucible including said speed change means controls the rotation speed of said crucible within a rotation accuracy to less than ±0.02 rpm at the given rotation speed.

9. The device of claim 7, wherein the given rotation speed is less than about 2 rpm.

10. A process for controlling rotation accuracy of a crucible, said process comprising:

providing a silicon melt within a crucible;

rotating said crucible at a rotation speed;

controlling the rotation speed of said crucible so that the rotation speed is maintained substantially at a given rotation speed; and pulling a single crystal from said crucible.

11. The process of claim 10, further comprising applying a magnetic field to said silicon melt.

12. The process of claim 11, wherein the step of controlling further comprises controlling said rotation speed to a rotation accuracy of less than ±0.02 rpm at the given rotation speed.

13. The process of claim 10, wherein the step of controlling further comprises controlling said rotation speed to a rotation accuracy of less than ±0.02 rpm at the given rotation speed.

14. The process of claim 10, further comprising changing said rotation speed within a rotation accuracy of less than ±0.02 rpm during said pulling step.

15. The process of claim 11, further comprising changing said rotation speed within a rotation accuracy of less than ±0.02 rpm during said pulling step.

16. The process of claim 10, wherein the given rotation speed is less than about 2 rpm.

17. A device for producing a single crystal by a Czochralski method, comprising:

a crucible for containing silicon melt therein;

a mechanism that pulls a single crystal from the crucible;

a motor for rotating the crucible; and a speed change device operatively connected to the motor and crucible for controlling a rotation speed of the crucible so that the rotation speed is maintainable substantially at a given rotation speed.

18. The device of claim 17, wherein the motor is a servomotor.

19. The device of claim 17, wherein the motor comprises a first shaft and the crucible comprises a second shaft, and the speed change device changes a speed of rotation of the second shaft.

20. The device of claim 19, wherein the speed change device increases a reduction ratio of a speed of rotation of the first shaft to the speed of rotation of the second shaft, so as to increase the accuracy of the rotation speed of the crucible.

21. The device of claim 17, further comprising a device that generates a magnetic field which is applied to the silicon melt.

22. The device of claim 17, wherein the rotation speed is controlled such that a rotation accuracy of the crucible is controlled to less than ±0.02 rpm at the given rotation speed.

* * * * *